(12) United States Patent
Barnhart

(10) Patent No.: US 6,185,710 B1
(45) Date of Patent: Feb. 6, 2001

(54) HIGH-PERFORMANCE IEEE1149.1-COMPLIANT BOUNDARY SCAN CELL

(75) Inventor: Carl Frederick Barnhart, Round Rock, TX (US)

(73) Assignee: International Business Machines Corporation, Armonk, NY (US)

(*) Notice: Under 35 U.S.C. 154(b), the term of this patent shall be extended for 0 days.

(21) Appl. No.: 09/050,599

(22) Filed: Mar. 30, 1998

(51) Int. Cl.$^7$ .................................................. G01R 31/28
(52) U.S. Cl. ........................................................ 714/727
(58) Field of Search .................................. 714/724, 727, 714/731

(56) References Cited

U.S. PATENT DOCUMENTS

| | | |
|---|---|---|
| 4,628,216 | 12/1986 | Mazumder . |
| 5,042,034 | 8/1991 | Correale et al. . |
| 5,056,094 | 10/1991 | Whetsel . |
| 5,488,614 * | 1/1996 | Shima ................................. 714/727 |
| 5,602,855 | 2/1997 | Whetsel, Jr. . |
| 5,615,217 * | 3/1997 | Horne et al. .......................... 714/726 |
| 5,631,911 | 5/1997 | Whetsel, Jr. . |
| 5,719,879 | 2/1998 | Gillis et al. . |
| 5,757,820 * | 5/1998 | Angelotti .............................. 714/738 |
| 5,920,575 | 7/1999 | Gregor et al. . |
| 5,925,143 | 7/1999 | Gillis et al. . |
| 5,938,782 | 8/1999 | Kay . |

OTHER PUBLICATIONS

Groves et al., IBM Technical Disclosure Bulletin, "High-Performance CMOS Register", vol. 33, No. 3B, Aug. 1990, pp. 363–366.

* cited by examiner

*Primary Examiner*—Albert De Cady
*Assistant Examiner*—Shelly A Chase
(74) *Attorney, Agent, or Firm*—Leslie A. VanLeeuwen; Felsman, Bradley, Vaden, Gunter & Dillon, LLP

(57) ABSTRACT

A circuit is disclosed that includes a latch circuit and boundary scan cell circuitry. The latch circuit includes a slave latch and a master latch having a data output. The slave latch includes at least a first data input connected to the data output of the master latch, a second data input, and a control input that receives a control signal that controls latching of data present at the second data input. The boundary scan cell circuitry is connected to the second data input and to the control input of the slave latch so that the boundary scan cell circuitry can supply the control signal and data to the slave latch. In one embodiment, the boundary scan cell circuitry is IEEE1149.1-compliant and the circuit further includes either an output driver coupled to the data output of the slave latch or an input receiver coupled to a data input of the master latch.

22 Claims, 7 Drawing Sheets

HIGH-PERFORMANCE IEEE1149.1-COMPLIANT BOUNDARY SCAN CELL

BACKGROUND OF THE INVENTION

1. Technical Field

The present invention relates in general to integrated circuitry and, in particular, to a boundary scan cell of an integrated circuit. Still more particularly, the present invention relates to a high-performance IEEE1149.1-compliant boundary scan cell of an integrated circuit.

2. Description of the Related Art

A significant expense incurred during the manufacture of circuit cards carrying one or more integrated circuit components is testing. Such testing generally entails stimulating the input/output (I/O) pins of a circuit card with a predetermined pattern of inputs and then observing the outputs generated by the components residing on the circuit card. Several factors contribute to the expense of circuit card testing. First, because many circuit card components do not employ a standard I/O interface, circuit card testing fixtures tend to be complex and must often be custom-designed to test particular circuit cards. Second, the input pattern utilized to stimulate a circuit card must often be generated manually in order to ensure that circuit card components are exercised over a sufficient range of functionality to ensure high quality. Third, while it may be less expensive for a circuit card or component manufacturer to out-source testing to an outside contractor, the use of non-standard component interfaces can require the component manufacturer to reveal proprietary information concerning the internal design of a component to the component tester, making many manufacturers reluctant to engage an outside contractor to perform testing.

In order to decrease the cost and increase the quality of component testing, the IEEE (Institute of Electrical and Electronic Engineers) adopted the IEEE1149.1-1990 Standard Test Access Port and Boundary Scan Architecture (hereinafter referred to as the IEEE1149.1 standard). The IEEE1149.1 standard specifies that a boundary scan cell be inserted between the functional logic of a component and each of its input receiver and output driver circuits. These boundary scan cells, whose behavior is prescribed in detail by the IEEE1149.1 standard, are typically implemented with at least a 2-to-1 multiplexer in the direct path between the component's functional logic and the driver or receiver. For example, referring now to FIG. 1, there is depicted a high level block diagram of a conventional circuit card 10 bearing two integrated circuit chips interconnected through IEEE1149.1-compliant interfaces. As shown, integrated circuit chips 12 and 14 each include an edge-sensitive D flip-flop 20 that operates in response to clock signal 22. D flip-flop 20 of integrated circuit chip 12 has a data input (D) connected to the functional logic of integrated circuit chip 12, and D flip-flop of integrated circuit chip 14 has a data output (Q) connected to the functional logic of integrated circuit chip 14. Between each of D flip-flops 20 and a respective one of output driver 30 and input receiver 32 is a 2-to-1 multiplexer 24, which has a first data input tied to an IEEE1149.1-compliant boundary scan cell 26 and a second data input and a select input supplied by the associated boundary scan cell 26. The output of each of multiplexers 24 also forms an input of the associated boundary scan cell 26.

While the implementation of conventional IEEE1149.1-compliant interfaces within components, such as integrated circuit chips 12 and 14, facilitates higher quality, low cost testing without the need for disclosure of the internal circuitry of the components under test, these benefits come at the expense of performance due to the signal path delay associated with two multiplexers 24 and the signal path loading associated with boundary scan cells 26. Because of the performance penalty associated with conventional IEEE1149.1-compliant boundary scan cells, manufacturers have resisted compliance with the IEEE1149.1 standard for at least eight years. The present invention includes a recognition that it would be desirable to provide an improved boundary scan cell that complies with the IEEE1149.1 standard and is not subject to the performance penalty associated with conventional implementations.

SUMMARY OF THE INVENTION

It is therefore one object of the present invention to provide improved integrated circuitry.

It is another object of the present invention to provide an improved boundary scan cell of an integrated circuit.

It is yet another object of the present invention to provide a high-performance IEEE1149.1-compliant boundary scan cell of an integrated circuit.

The foregoing objects are achieved as is now described. A circuit is provided that includes a latch circuit and boundary scan cell circuitry, which is preferably IEEE1149.1-compliant. The latch circuit includes a slave latch and a master latch having a data output. The slave latch includes at least a first data input connected to the data output of the master latch, a second data input, and a control input that receives a control signal that controls latching of data present at the second data input. The boundary scan cell circuitry is connected to the second data input and to the control input of the slave latch so that the boundary scan cell circuitry can supply the control signal and data to the slave latch.

In one embodiment, the circuit further includes either an output driver coupled to the data output of the slave latch or an input receiver coupled to a data input of the master latch. In this manner, the circuit, which may comprise, for example, an integrated circuit chip mounted on a circuit card, can be interconnected to a second integrated circuit chip equipped with a similar circuit comprised of a latch and boundary scan cell circuitry.

The above as well as additional objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF ILLUSTRATIVE EMBODIMENT

Figure 2:
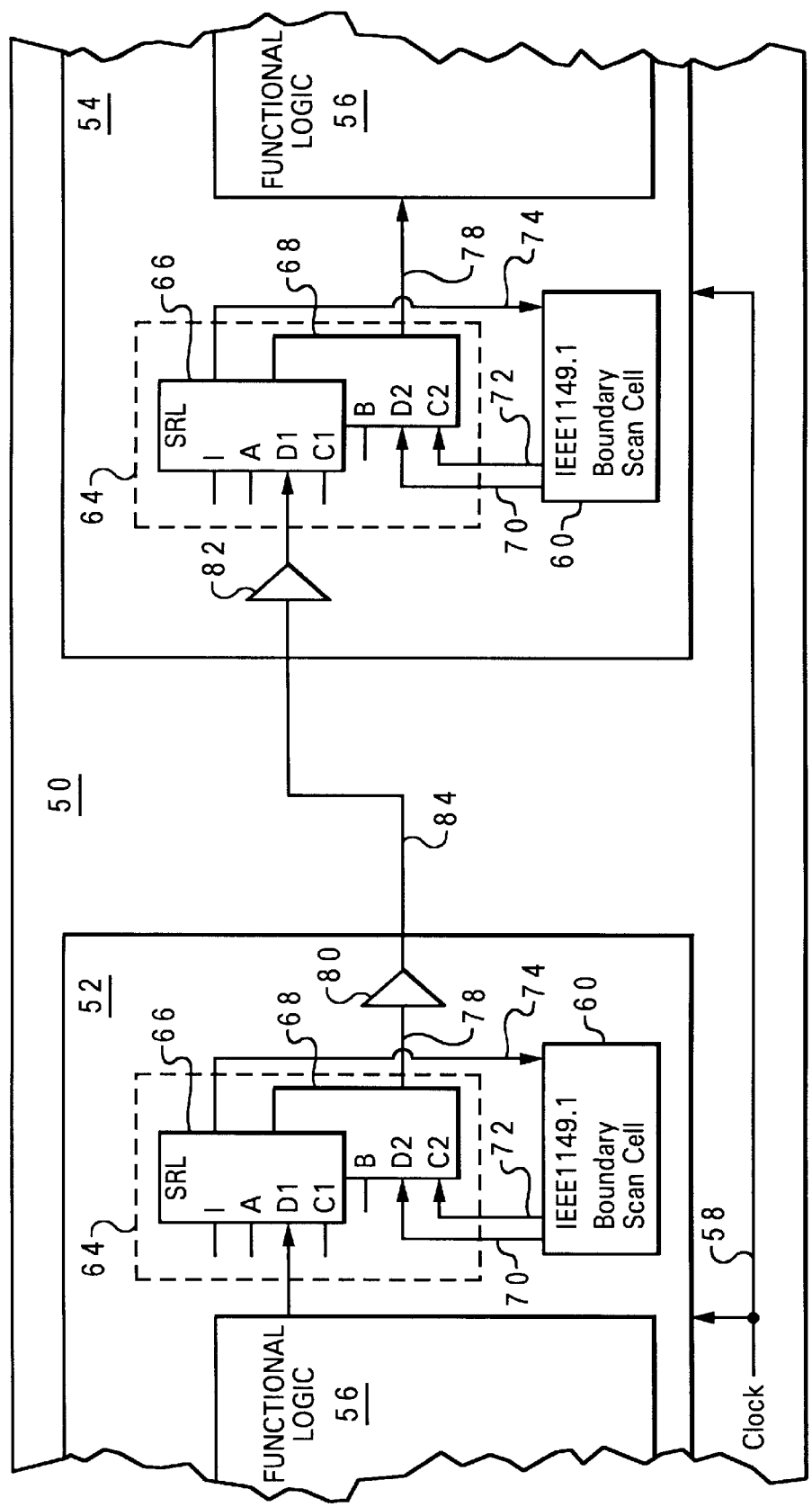
FIG. 2 depicts a high level block diagram of a circuit card on which are mounted interconnected integrated circuit chips that each include IEEE1149.1-compliant boundary scan cells in accordance with the present invention.

With reference again to the figures and in particular with reference to FIG. 2, there is depicted a high level block diagram of a circuit card on which are mounted interconnected integrated circuit chips that each include IEEE1149.1-compliant boundary scan cells in accordance with the present invention. Thus, as shown, a first integrated circuit chip 52 and a second integrated circuit chip 54 are each mounted on a circuit card 50. The function of each of integrated circuit chips 52 and 54 is determined by its respective functional logic 56. For example, integrated circuit 52 may comprise a processor and integrated circuit chip 54 may comprise a cache memory, ASIC (Application Specific Integrated Circuit), or other support chip. In the illustrated embodiment, the operation of integrated circuit chips 52 and 54 is synchronized by clock signal 58.

As shown in FIG. 2, integrated circuit chips 52 and 54 are each equipped with an IEEE1149.1-compliant boundary scan cell 60. However, in contrast to conventional integrated circuit chips 12 and 14 discussed supra, each of integrated circuit chips 52 and 54 includes an enhanced shift register latch (SRL) 64 in lieu of a D flip-flop and multiplexer. Enhanced SRLs 64 are each comprised of a master latch 66 and a slave latch 68; however, the number and types of inputs and outputs of master latches 66 and slave latches 68 can vary between implementations depending upon what type of SRLs are utilized. For example, if a mux-scan SRL is utilized, each master latch has a single clock input, at least two data inputs, and a select input that chooses which data input will be captured in response to the clock input. Alternatively, if a dual-port SRL is utilized as shown in FIG. 2, the master latch has a plurality of clock inputs (C1 and A) that are each associated with a respective one of multiple data inputs (D1 and I), such that the transition of a particular clock to an active state causes the master latch to capture data present at the associated data input. In this manner, a first data input (D1) can receive functional inputs associated with normal operation, while a second data input (I) can be connected to form a scannable register that a tester can utilize to scan test stimuli into the SRL 64.

In contrast to conventional SRLs, the enhanced SRL 64 of the present invention includes a slave latch that is also equipped with multiple data inputs. Like master latches 66, slave latches 68 can be implemented as either dual-port latches (as shown in FIG. 2) or mux-scan latches. By utilizing a slave latch with multiple data inputs, the functionality of the multiplexer shown in FIG. 1 can be merged with the functionality of the slave latch 68 without introducing additional delay in the signal patch between functional logic 56 of integrated circuit chip 52 and functional logic 56 of integrated circuit chip 54. In a dual-port embodiment, this advance is achieved by connecting the conventional data signal 70 and conventional control (select) signal 72 provided by boundary scan cell 60 to the second data input (D2) and second clock input (C2), respectively, of slave latch 68. Alternatively, in a mux-scan embodiment, control signal 72 provided by boundary scan cell 60 is connected to the select input of the slave latch. In either a dual-port or mux-scan embodiment, the first clock input (B) is connected to a clock signal that is 180° out of phase with the clock signal connected to the first clock input (C1) of master latch 66, and the first data input (internal to the latch and therefore not shown) of slave latch 68 is connected to data output 74 of master latch 66. The functional clock signals of SRLs 64, that is, the clock signals connected to clock inputs C1 and B, are disabled when the IEEE1149.1 Test Access Port (TAP) requires control, thereby preventing functional data from being latched.

Figure 1:
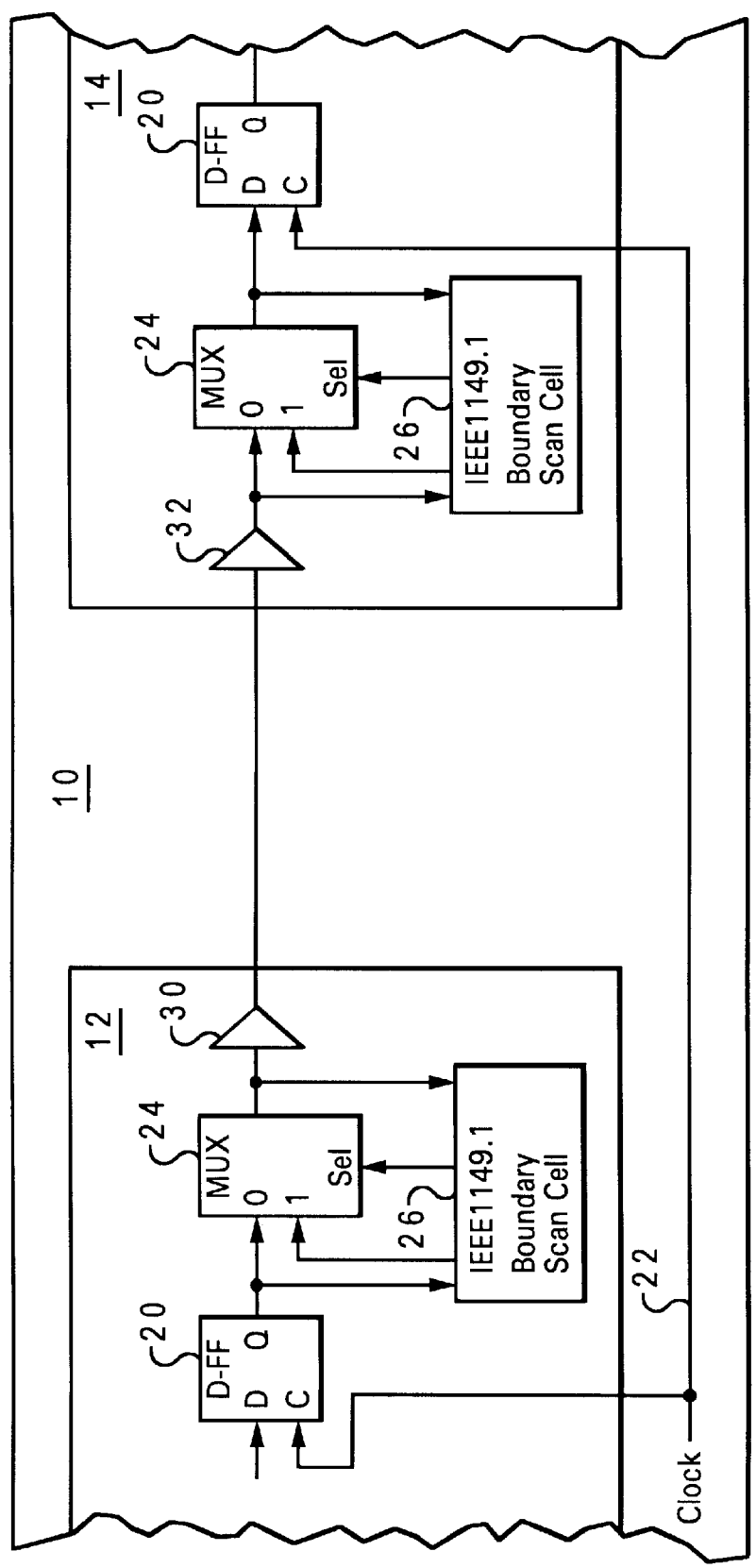
FIG. 1 illustrates a circuit card on which are mounted interconnected integrated circuit chips that each include a conventional IEEE1149.1-compliant boundary scan cell.

In order to minimize the loading of the signal path, data output 74 of master latch 66, which is equivalent to input 0 of multiplexer 24 of FIG. 1, is preferably the only connection between the signal path and boundary scan cell 60. In order for this equivalence to hold, the functional clock to the master latch must be held in flush state whenever functional clocks are disabled. The loading associated with the connection between the output of multiplexer 24 and boundary scan cell 26 in FIG. 1 is eliminated in the embodiment of FIG. 2 through judicious design of boundary scan cell 60, generally by incorporating a multiplexer within boundary scan cell 60 in parallel with slave latch 68, as discussed in greater detail below with respect to FIG. 3. Two inputs of this multiplexer (i.e., input 1 and the select input as shown in FIG. 1) are supplied by boundary scan cell 60, and the other data input is supplied by master data output 74 as discussed above. In some embodiments of boundary scan cell 60, logic simplification may result in the elimination of the multiplexer, but this is not always possible.

As depicted in FIG. 2, each of enhanced SRLs 64 has additional interconnections that are dependent upon whether the SRL 64 is an input latch or an output latch. SRL 64 of integrated circuit 52, which is an output latch, has an interconnection between the first data input (D1) of its master latch 66 and functional logic 56 of integrated circuit 52 such that functional logic 56 supplies output data to master latch 66. In addition, data output 78 of slave latch 68 is connected to the data input of output driver 80. Output driver 80 drives output data received from slave latch 68 to input receiver 82 of integrated circuit 54 via an interconnect 84 patterned on circuit card 50. As an input latch, SRL 64 of integrated circuit 54 has an interconnection between the first data input (D1) of its master latch 66 and the output of data receiver 82. In addition, data output 78 of slave latch 68 is connected to functional logic 56 of integrated circuit 54 such that the data received from integrated circuit 52 is supplied to functional logic 56 of integrated circuit 54.

Referring now to FIGS. 3–7, there are depicted illustrative embodiments of a number of different I/O cell implementations of the high level design illustrated in FIG. 2. The circuit designations used in these figures (MUX21, LPH0101, etc.) correspond to circuits described in detail in *ASIC SA-12 Databook*, which is available as Order No. SA14-2211-00 from IBM Microelectronics Division of Hopewell Junction, N.Y., and is incorporated herein by reference in its entirety. The signal names and terminology utilized in FIGS. 3–7, which follow the usage of the databook incorporated by reference supra, are defined as follows:

RDI (Receiver Data Input): Input to the I/O cell from the input receiver.

RDO (Receiver Data Output): Output of the I/O cell to the functional logic.

DDI (Driver Data Input): Input to the I/O cell from the functional logic.

DDO (Driver Data Output): Output of the I/O cell to the output driver.

EDI (Enable Data Input): Enable signal received by the I/O cell from the functional logic.

EDO (Enable Data Output): Enable signal output from the I/O cell to the output driver.

RClkC, RClkB: Functional master and slave clocks, respectively, for the receiver latch. When functional operation is disabled, RClkC is enabled, and RClkB is disabled.

DClkC, DClkB: Functional master and slave clocks, respectively, for the driver latch. When functional operation is disabled, DClkC is enabled, and DClkB is disabled.

EClkC, EClkB: Functional master and slave clocks, respectively, for the enable latch. When functional operation is disabled, EClkC is enabled, and EClkB is disabled.

CE0_A: SRL test scan clock for master latches. It is disabled during functional (normal) operation.

CE1_B: SRL test scan clock for slave latches. It is enabled during functional (normal) operation.

CE1_C1, CE1_C2: SRL functional clocks for master latches. These clocks are enabled during normal operation.

test_si, test_so: Connections to the test scan chain that are utilized for chip testing at the foundry.

BIDI_cntl: Control signal specifying whether a bi-directional I/O cell is driving or receiving data.

Mode_A: Decode of the IEEE1149.1 TAP Instruction Register that is active if either the INTEST or RUN-BIST instructions are loaded.

Mode_B: Decode of the IEEE1149.1 TAP Instruction Register that is active if any of the INTEST, RUNBIST, EXTEST, HIGHZ, or CLAMP instructions are loaded.

EXTEST: Decode of the IEEE1149.1 TAP Instruction Register that is active if the EXTEST instruction is loaded.

HIGHZ: Decode of the IEEE1149.1 TAP Instruction Register that is active if the HIGHZ instruction is loaded.

ShiftClk: Clock output of the IEEE1149.1 TAP that pulses on the rising edge of the TCK input when the TAP is in the Shift Data Register state and the boundary register is selected by the instruction loaded in the Instruction Register.

CaptureClk: Clock output of the IEEE1149.1 TAP that pulses on the rising edge of the TCK input when the TAP is in the Capture Data Register state and the boundary register is selected by the instruction loaded in the Instruction Register.

UpdateClk: Clock output of the IEEE1149.1 TAP that pulses on the falling edge of the TCK input when the TAP is in the Update_Data_Register state and the boundary register is selected by the instruction loaded in the Instruction Register.

L2 Clk: Clock output of the IEEE1149.1 TAP that pulses on the falling edge of the TCK input when the boundary register is selected by the instruction loaded in the Instruction Register.

TDI, TDO: Connections to the IEEE1149.1 Boundary Register scan chain.

Figure 3:
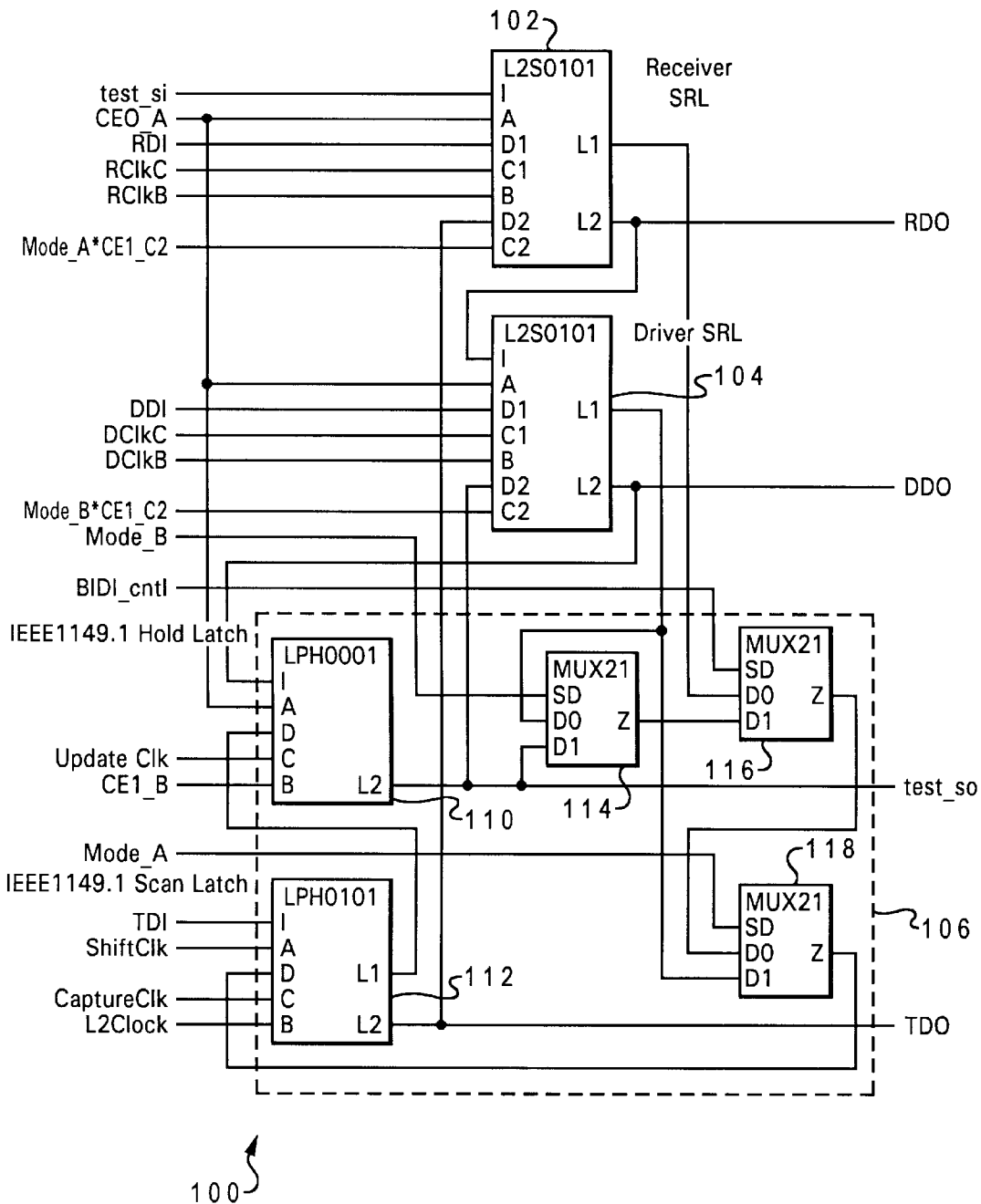
FIG. 3 illustrates an input/output (I/O) cell design having separate in-line latches for the input receiver and output driver of a bi-directional I/O port of an integrated circuit chip.

With reference now to FIG. 3, there is illustrated an exemplary embodiment of an I/O cell design having separate in-line SRL latches for the input receiver and output driver of a bi-directional I/O port of an integrated circuit chip. As depicted, I/O cell 100 includes a dual-port receiver SRL 102, a dual-port driver SRL 104, and an IEEE1149.1-compliant boundary scan cell 106. Boundary scan cell 106 includes IEEE1149.1 hold latch 110, IEEE1149.1 scan latch 112, and three multiplexers 114, 116, and 118.

Receiver SRL 102 has a first master data input (D1) connected to RDI such that receiver SRL 102 receives data input from an input receiver, a second master data input (I) connected to test_si, the signal from the test scan chain, and a master data output (Li) connected to data input D0 of multiplexer 116. Latching of test_si by the master latch of receiver SRL 102 is controlled by CEO_A, which is connected to master clock input A. The latching of functional data by the master latch of receiver SRL 102 is controlled by the RClkC signal connected to master clock input C1. As discussed supra with respect to FIG. 2, the first data input of the slave latch of receiver SRL 102 is internally connected to master data output L1 and is clocked by the RClkB signal connected to slave clock input B. The second slave data input D2 is connected to slave data output L2 of IEEE1149.1 scan latch 112 and is clocked by the clock signal received at the second slave clock input C2. The slave latch output L2 of receiver SRL 102 supplies RDO to the functional logic of the integrated circuit including I/O cell 100 and is also connected to the master data test input (I) of driver SRL 104.

Driver SRL 104 has a first master data input D1 connected to DDI such that receiver SRL 104 receives data from the functional logic of the integrated circuit including I/O cell 100. Driver SRL 104 further includes a master data output L1 connected to data input D1 of multiplexer 116 and data input D0 of multiplexer 114. Latching of RDO by the master latch of receiver SRL 102 is controlled by CEO_A, meaning that master latch output L1 of driver SRL 104 follows RDO during scan testing. During functional operation CEO_A is disabled and capture of DDI is controlled by DClkC, which is connected to master clock input C1. Similar to receiver SRL 102, the first data input of the slave latch of driver SRL 104 is internally connected to master data output L1 and is clocked by the DClkB signal connected to slave clock input B. The second slave data input D2 is connected to slave data output L2 of IEEE1149.1 hold latch 110 and is clocked by the clock signal received at the second slave clock input C2. The slave latch output L2 of driver SRL 104 supplies DDO to an output driver of the integrated circuit including I/O cell 100 and is also connected to data input I of IEEE1149.1 hold latch 110. It is also important to note that multiplexers 114 and 116 have been incorporated into boundary scan cell 106 in parallel with SRLs 102 and 104 as discussed supra with respect to FIG. 2 in order to eliminate loading that would otherwise be present on slave outputs L2 of SRLs 102 and 104.

Because the operation of boundary scan cell 106 is closely prescribed by the widely available IEEE1149.1 standard, a detailed explanation of its operation is omitted here. However, it should be understood that the embodiments of I/O cells shown in FIGS. 3–7 support IEEE1149.1 boundary scan chain testing, whereby test stimuli are scanned into a boundary register scan chain connected to the TDI input of IEEE1149.1 scan latch 112, latched through boundary scan cell 106 in response to the ShiftClk signal connected to clock input A of IEEE1149.1 scan latch 112, and output via slave output L2 of IEEE1149.1 scan latch 112 as the TDO signal. Further details of the particular implementation of the IEEE1149.1 standard illustrated in FIGS. 3–7 may be found in IEEE1149.1 *Boundary-Scan in IBM ASICs*, which is available from IBM Microelectronics Division as Order No. SA14-2282-03 and is incorporated herein by reference.

The dual-port I/O cells illustrated in FIGS. 4–7 also support LSSD (Level Sensitive Scan Design) chip testing. In LSSD chip testing, test stimuli are loaded into an LSSD test scan chain connected to the second master data input (I) of a receiver, driver, or enable SRL. In response to the CEO_A signal connected to clock input A of the SRL, the SRL latches the test_si input provided by the LSSD scan chain signal. By supplying alternating pulses of clock signals connected to the A and B clock inputs of the various latches used in each embodiment, the test stimuli propagate through the latch circuitry and are output to the LSSD scan chain as the test_so signal. Of course, in alternative embodiments that utilize mux-scan latches instead of dual-port latches, similar chip testing can be conducted utilizing appropriate test input and clock signals.

Figure 4:
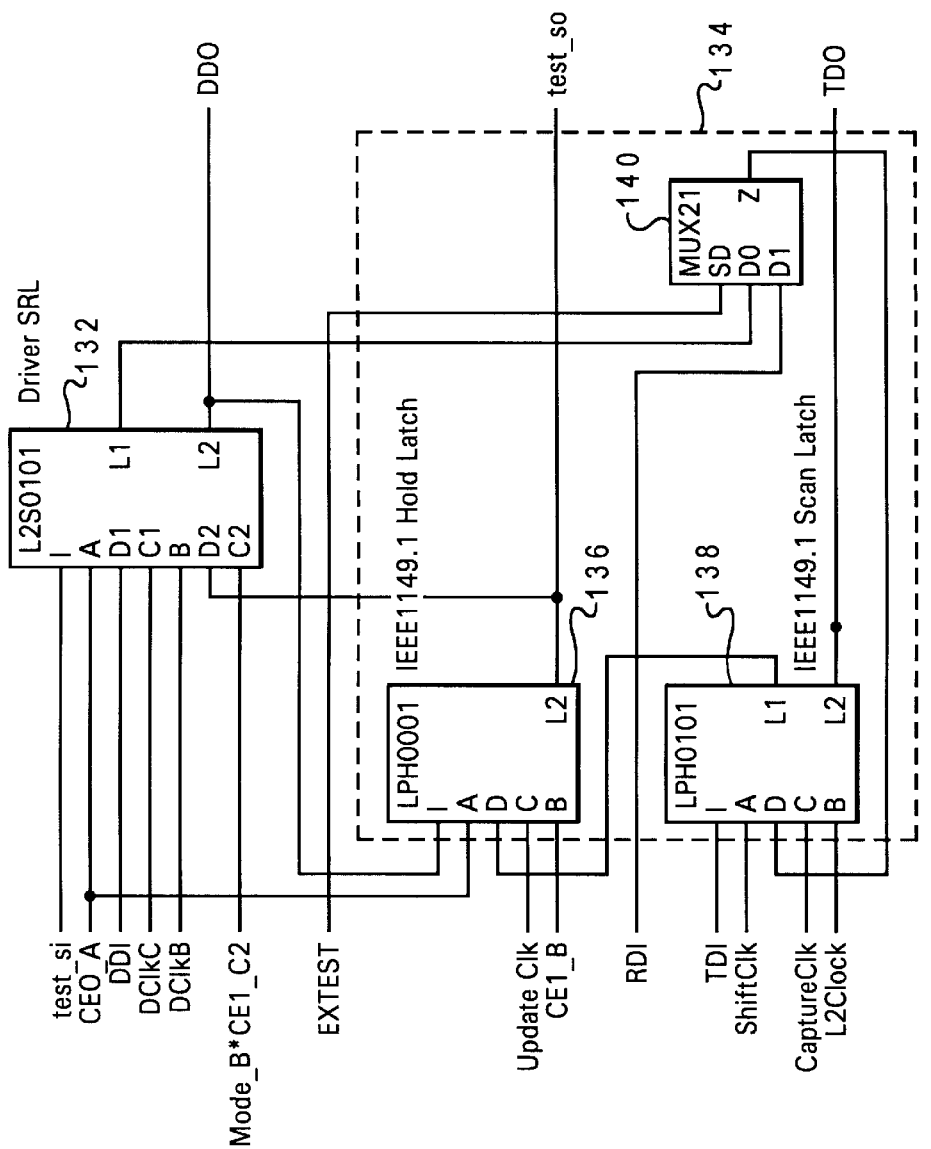
FIG. 4 depicts an I/O cell design that contains only a driver data in-line latch for functional operation, but can capture receiver data for chip test purposes.

Referring now to FIG. 4, there is depicted an illustrative embodiment of an I/O cell design that contains only a driver SRL for functional operation, but can capture receiver data for chip test purposes. As illustrated, I/O cell 130 includes a driver SRL 132, which is coupled to an IEEE1149.1-compliant boundary scan cell 134 comprising IEEE1149.1 hold latch 136, IEEE1149.1 scan latch 138, and multiplexer 140. Driver SRL 132 has the same interconnections as driver SRL 104 of FIG. 3, except that the second master data input I is directly connected to test scan chain input test_si. DDO can be a two-state or three-state signal in functional operation. Multiplexer 140, in addition to having data input D0 connected to master data output L1 of driver SRL 132, has a second data input D1 connected in RDI. Thus, although I/O cell 130 can only drive output data during functional operation, the connection of multiplexer data input D1 to RDI permits receiver data to be captured during scan testing (i.e., when EXTEST is active).

Figure 5:
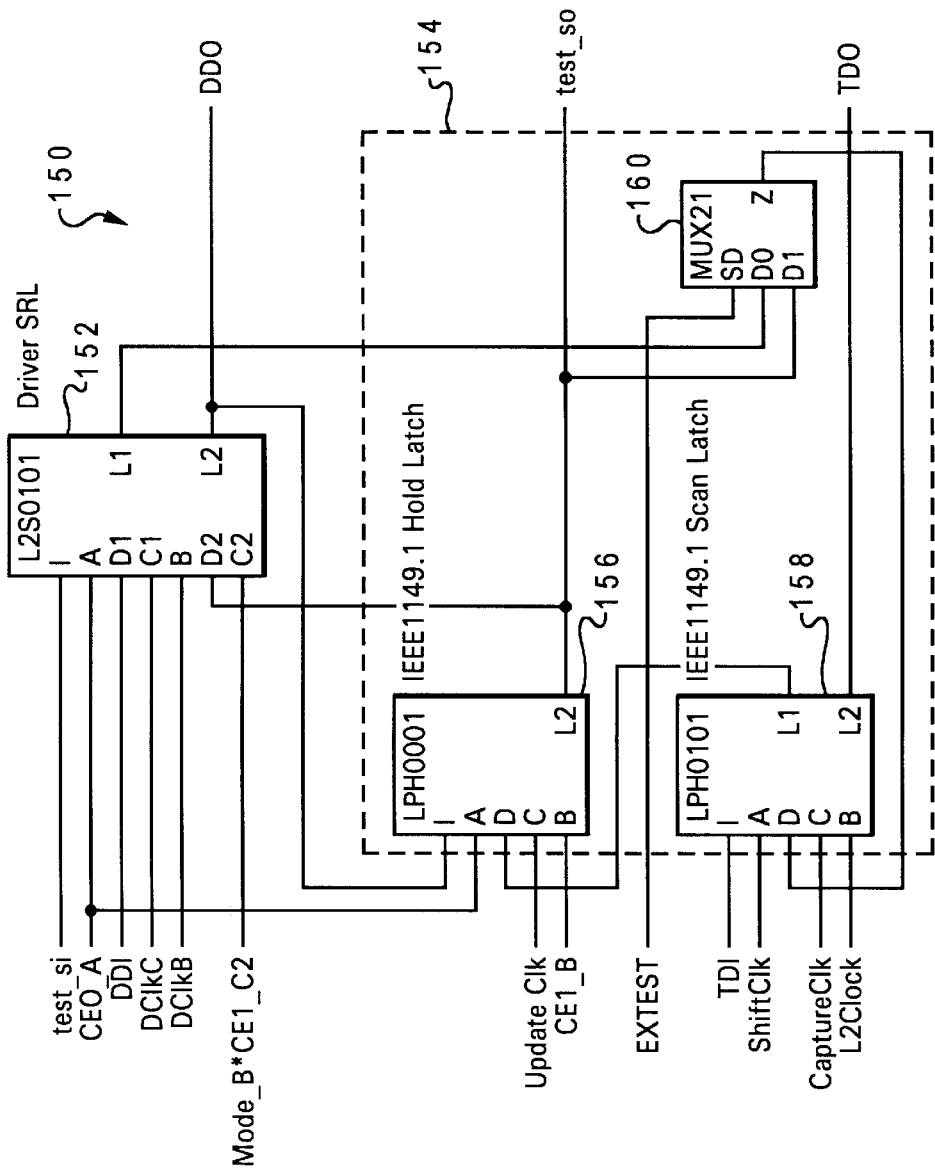
FIG. 5 illustrates an I/O cell design that contains only a driver data in-line latch for use with a two or three state output-only port.

With reference now to FIG. 5, there is illustrated an exemplary embodiment of an I/O cell design that contains a driver SRL for use with a two or three state output-only port. As shown, I/O cell 150 includes a driver SRL 152 coupled to an IEEE1149.1-compliant boundary scan cell 154, which contains IEEE1149.1 hold latch 156, IEEE1149.1 scan latch 158, and multiplexer 160. The embodiment depicted in FIG. 5 is identical to that illustrated in FIG. 4, with the exception that data input D1 of multiplexer 160 is connected to data output L2 of IEEE1149.1 hold latch 156 rather than RDI. Accordingly, when EXTEST is active, multiplexer 160 feeds the test_so signal output by IEEE1149.1 hold latch 156 back to IEEE1149.1 scan latch 158 rather than supplying receiver input data.

Figure 6:
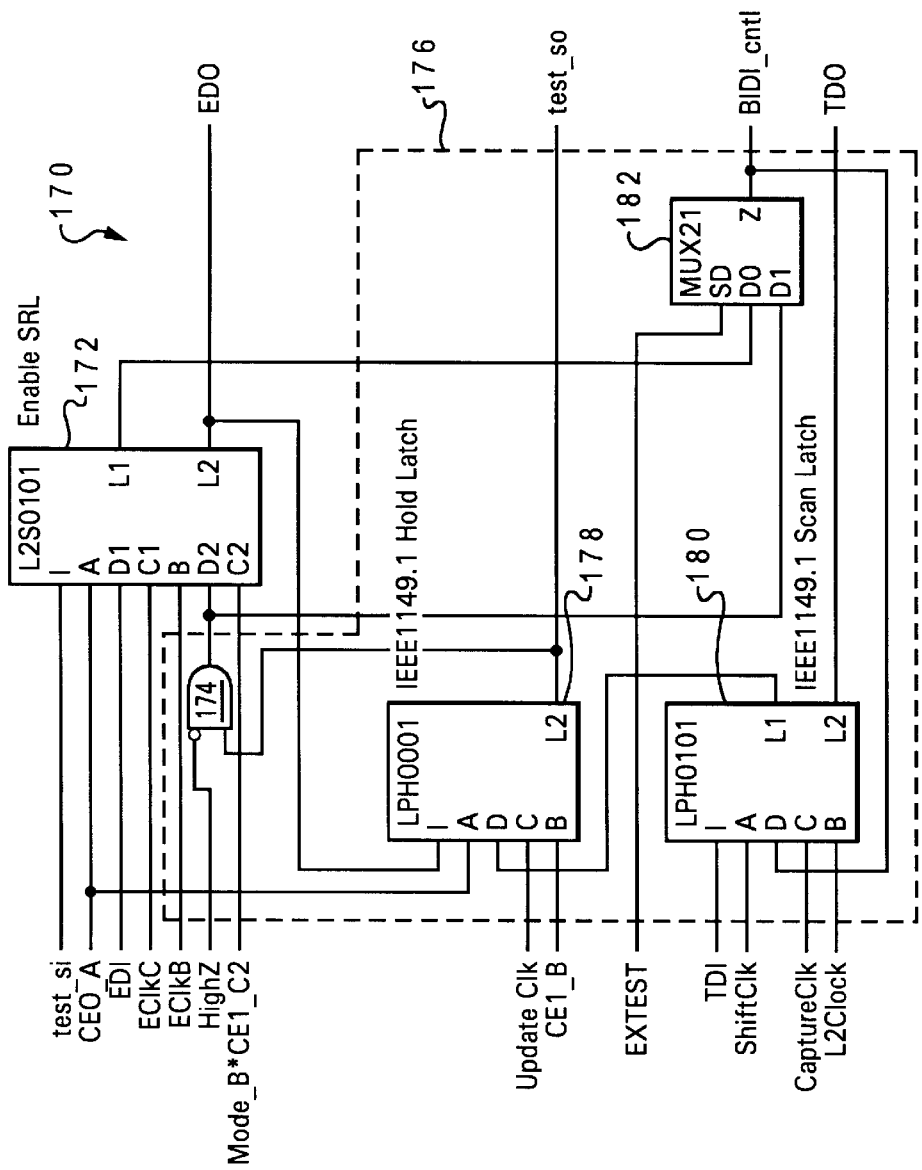
FIG. 6 depicts an I/O cell that contains only an enable data in-line latch for controlling one or more bi-directional or three-state ports.

Referring now to FIG. 6, there is depicted an illustrative embodiment of an I/O cell that contains an enable SRL for controlling one or more bi-directional or three-state ports. As illustrated, I/O cell 170 contains enable SRL 172 and an IEEE1149.1-compliant boundary scan cell 176 including an AND gate 174. Enable SRL 172 includes a dual-port latch having a first master data input (D1) connected to the EDI signal received from the integrated circuit's functional logic and a second master data input (I) connected to test scan chain input test_si. The first and second master data inputs are clocked by clock signals EClkC and CEO_A, respectively. The slave latch of enable SRL 172 is also a dual-port latch and includes a first slave data input (not shown) connected to master data output L1 and a second slave data input (D2) connected to the output of AND gate 174. The first and second slave data inputs are clocked by the EClkB and Mode_B*CE1_C2 signals, respectively, which are connected to the B and C2 clock inputs of the slave latch of enable SRL 172. During functional operation, the clock signal connected to clock input C2 is disabled and EClkB is enabled. Conversely, during testing, the clock signal connected to clock input C2 is enabled, and data is latched at data input D2 if the HIGHZ instruction is not loaded in the TAP instruction register and the test so signal output by IEEE1149.1 hold latch 178 is active.

The interconnections between boundary scan cell 176 and enable SRL 172 are the same as the interconnections between driver SRL 152 and boundary scan cell 154 of FIG. 5, except that data input D2 of enable SRL 172 is not directly connected to the test_so signal generated by IEEE1149.1 hold latch 178, but is instead qualified with an inverted HIGHZ signal by AND gate 172. In addition, the second data input D1 of multiplexer 182 is connected to the output of AND gate 174 rather than directly to the test_so signal generated by IEEE1149.1 hold latch 178.

Figure 7:
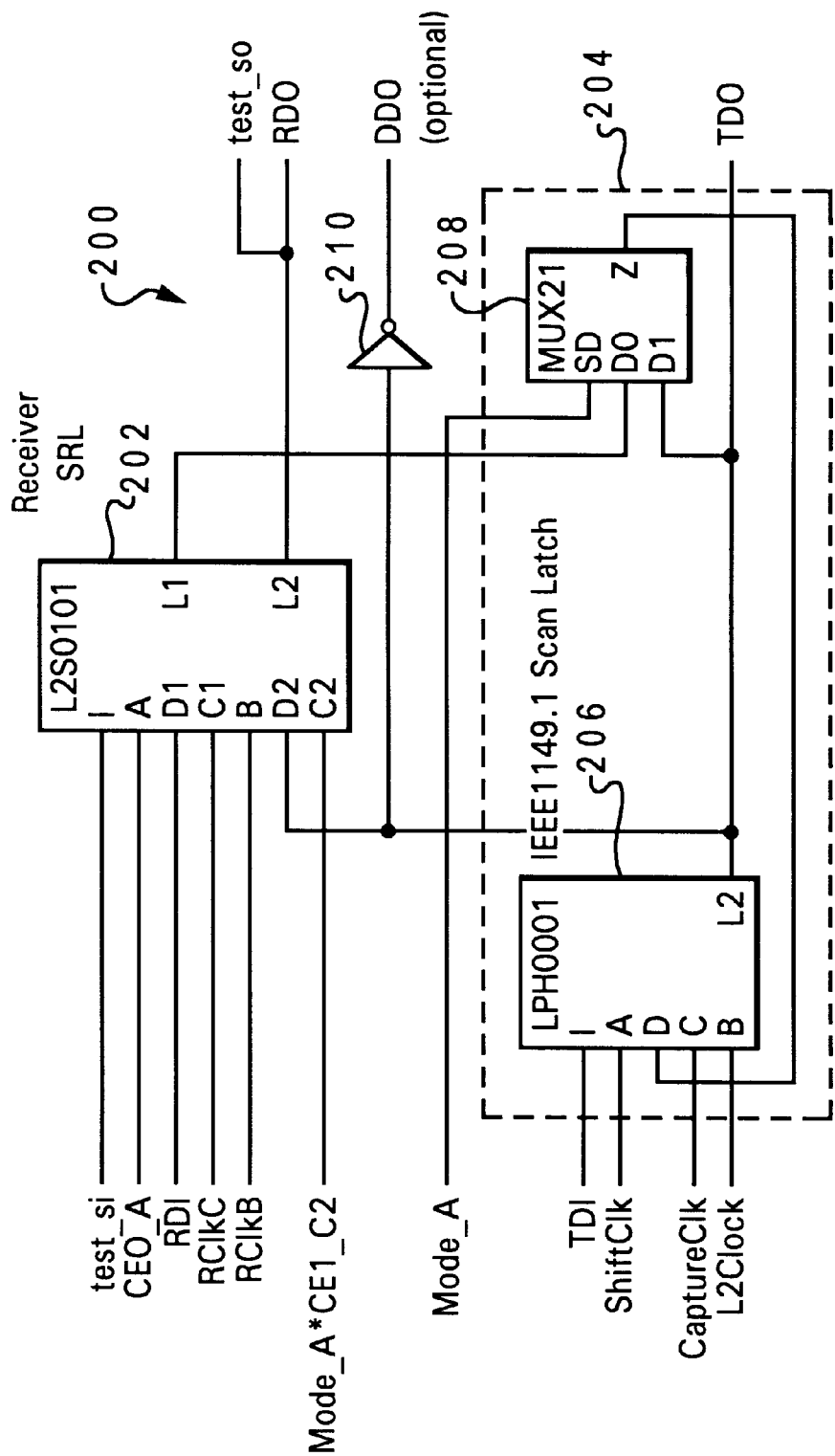
FIG. 7 illustrates an I/O cell design that contains only a receiver data in-line latch for a port that is functionally input-only, but optionally has a driver output to support chip testing.

With reference now to FIG. 7, there is illustrated an exemplary embodiment of an I/O cell design that contains only a receiver SRL for a port that is functionally input-only, but optionally has a driver output to support chip testing. Thus, as shown in FIG. 7, I/O cell 200 has a receiver SRL 202, an optional output inverter 210, and an IEEE1149.1-compliant boundary scan cell 204. Receiver SRL 202 includes a dual-port latch having a first master data input (D1) connected to the RDI signal received from the integrated circuit's functional logic and a second master data input (I) connected to test scan chain input test_si. The first and second master data inputs are clocked by clock signals RClkC and CEO_A, respectively. The slave latch of receiver SRL 202 is also a dual-port latch and includes a first slave data input (not shown) connected to master data output L1 and a second slave data input (D2) connected to the TDO signal generated by IEEE1149.1 scan latch 206. The first and second slave data inputs are clocked by the RClkB and Mode_A*CE1_C2 signals, respectively, which are connected to the B and C2 clock inputs of the slave latch of receiver SRL 202. During functional operation, the CEO_A and the clock signal connected to clock input C2 are disabled, and RClkC and RClkB are enabled. Conversely, during testing, CEO_A and the clock signal connected to clock input C2 are enabled. The master data output L1 of receiver SRL 202 is connected to the first data input D0 of multiplexer 208, and the slave data output L2 supplies the RDO signal to the functional logic of the integrated circuit. As shown, the slave data output also forms the test_so signal connected to the test scan chain.

As described supra for receiver SRL 102 of FIG. 3, the TDO signal supplied by the L2 output of IEEE1149.1 scan latch 206 forms the second data input (D2) of receiver SRL 202. In addition, the TDO signal forms the second data input of multiplexer 208 and is inverted by optional output inverter 210 to produce an optional DDO signal that can be utilized during chip testing. As depicted, the IEEE1149.1 hold latch has been eliminated from boundary scan cell 204.

As has been described, the present invention satisfies a long felt need by providing a high performance circuit including an SRL and an IEEE1149.1 compliant boundary scan cell. In accordance with the present invention, the SRL includes master and slave latches that each have multiple data inputs. The boundary scan cell and the master and slave latches of the SRL are interconnected such that the data path is subject to only the block delay of the SRL (i.e., the data path does not include a multiplexer delay) and the slave data output of the SRL is not subject to loading by the boundary scan cell during functional operation.

While the invention has been particularly shown and described with reference to a preferred embodiment, it will be understood by those skilled in the art that various changes in form and detail may be made therein without departing from the spirit and scope of the invention.

What is claimed is:
1. A circuit, comprising:
   a latch circuit including a slave latch and a master latch having a data output, said slave latch including at least a first data input connected to said data output of said master latch, a second data input, and a control input that receives a control signal that controls latching of data present at said second data input by said slave latch; and boundary scan cell circuitry connected to said second data input and to said control input, wherein said boundary scan cell circuitry supplies said control signal and said data to said slave latch.

2. The circuit of claim 1, wherein said boundary scan cell circuitry is IEEE1149.1-compliant.

3. The circuit of claim 1, said slave latch having a data output, wherein said circuit further comprises an output driver having a driver input coupled to said data output of said slave latch.

4. The circuit of claim 1, said master latch having a data input, wherein said circuit further comprises an input receiver having a receiver output coupled to said data input of said master latch.

5. The circuit of claim 1, said slave latch having a first clock input connected to a first clock signal that enables latching of data present at said first data input, wherein said control input is a second clock input and said control signal is a second clock signal.

6. The circuit of claim 1, said slave latch having a clock input connected to a clock signal that enables latching of data by said slave latch, wherein said control signal received at said control input specifies from which of said first data input and said second data input data is to be latched in response to said clock signal.

7. The circuit of claim 1, wherein said data output of said master latch is connected to said boundary scan cell circuitry.

8. An integrated circuit, comprising:
a substrate;
an integrated circuit formed within said substrate, said integrated circuit including:
a latch circuit including a slave latch and a master latch having a data output, said slave latch including at least a first data input connected to said data output of said master latch, a second data input, and a control input that receives a control signal that controls latching of data present at said second data input by said slave latch; and
boundary scan cell circuitry connected to said second data input and to said control input, wherein said boundary scan cell circuitry supplies said control signal and said data to said slave latch;
functional logic coupled to said latch circuit.

9. The integrated circuit of claim 8, wherein said boundary scan cell circuitry is IEEE1149.1-compliant.

10. The integrated circuit of claim 8, said slave latch having a data output, wherein said circuit further comprises an output driver having a driver input coupled to said data output of said slave latch.

11. The integrated circuit of claim 8, said master latch having a data input, wherein said circuit further comprises an input receiver having a receiver output coupled to said data input of said master latch.

12. The integrated circuit of claim 8, said slave latch having a first clock input connected to a first clock signal that enables latching of data present at said first data input, wherein said control input is a second clock input and said control signal is a second clock signal.

13. The integrated circuit of claim 8, said slave latch having a clock input connected to a clock signal that enables latching of data by said slave latch, wherein said control signal received at said control input specifies from which of said first data input and said second data input data is to be latched in response to said clock signal.

14. The integrated circuit of claim 8, wherein said data output of said master latch is connected to said boundary scan cell circuitry.

15. An apparatus, comprising:
a circuit card; and
an integrated circuit mounted on said circuit card, said integrated circuit including:
a latch circuit including a slave latch and a master latch having a data output, said slave latch including at least a first data input connected to said data output of said master latch, a second data input, and a control input that receives a control signal that controls latching of data present at said second data input by said slave latch; and
boundary scan cell circuitry connected to said second data input and to said control input, wherein said boundary scan cell circuitry supplies said control signal and said data to said slave latch.

16. The apparatus of claim 15, wherein said boundary scan cell circuitry is IEEE1149.1-compliant.

17. The apparatus of claim 15, said slave latch having a data output, wherein said circuit further comprises an output driver having a driver output and a driver input coupled to said data output of said slave latch.

18. The apparatus of claim 17, wherein said integrated circuit is a first integrated circuit, said apparatus further comprising:
a second integrated circuit mounted on said circuit card, said second integrated circuit including:
an input receiver having a receiver output and a receiver input coupled to said driver output;
a latch circuit including a slave latch and master latch having a data input and a data output, wherein said data input of said master latch is coupled to said receiver output, and wherein said slave latch includes at least a first data input connected to said data output of said master latch, a second data input, and a control input that receives a control signal that controls latching of data present at said second data input by said slave latch; and
boundary scan cell circuitry connected to said second data input and to said control input, wherein said boundary scan cell circuitry supplies said control signal and said data to said slave latch.

19. The apparatus of claim 15, said slave latch having a first clock input connected to a first clock signal that enables latching of data present at said first data input, wherein said control input is a second clock input and said control signal is a second clock signal.

20. The apparatus of claim 15, said slave latch having a clock input connected to a clock signal that enables latching of data by said slave latch, wherein said control signal received at said control input specifies from which of said first data input and said second data input data is to be latched in response to said clock signal.

21. The apparatus of claim 15, wherein said data output of said master latch is connected to said boundary scan cell circuitry.

22. The apparatus of claim 15, wherein said circuit is an integrated circuit formed within a substrate, said circuit further including functional logic coupled to said latch circuit.

* * * * *